United States Patent
Wang et al.

(10) Patent No.: US 12,074,037 B2
(45) Date of Patent: Aug. 27, 2024

(54) PACKAGING METHOD FOR CIRCUIT UNITS COMPRISING CIRCUIT BASEPLATE

(71) Applicant: Weifang Goertek Microelectronics Co., Ltd., Shandong (CN)

(72) Inventors: Haisheng Wang, Shandong (CN); Dewen Tian, Shandong (CN); Qinglin Song, Shandong (CN)

(73) Assignee: Weifang Goertek Microelectronics Co., Ltd., Shandong (CN)

( * ) Notice: Subject to any disclaimer, the term of this patent is extended or adjusted under 35 U.S.C. 154(b) by 360 days.

(21) Appl. No.: 17/620,796

(22) PCT Filed: Dec. 6, 2019

(86) PCT No.: PCT/CN2019/123558
§ 371 (c)(1),
(2) Date: Dec. 20, 2021

(87) PCT Pub. No.: WO2020/253148
PCT Pub. Date: Dec. 24, 2020

(65) Prior Publication Data
US 2022/0406619 A1     Dec. 22, 2022

(30) Foreign Application Priority Data
Jun. 18, 2019   (CN) .......................... 201910529562.8

(51) Int. Cl.
*H01L 23/552*   (2006.01)
*H01L 21/306*   (2006.01)
(Continued)

(52) U.S. Cl.
CPC ...... *H01L 21/561* (2013.01); *H01L 21/30604* (2013.01); *H01L 23/552* (2013.01); *H01L 24/16* (2013.01); *H01L 2224/16225* (2013.01)

(58) Field of Classification Search
CPC ................. H01L 21/561; H01L 21/563; H01L 21/30604; H01L 24/16–20; H01L 2224/97; H01L 23/552; H01L 2924/3025
(Continued)

(56) References Cited

U.S. PATENT DOCUMENTS

2013/0307128 A1* 11/2013 Lin ........................ H01L 23/552
                                                                257/659
2018/0044177 A1*  2/2018 Vandemeer ........... H01L 23/367
(Continued)

FOREIGN PATENT DOCUMENTS

CN     102695405 A    9/2012
CN     103219298 A    7/2013
(Continued)

*Primary Examiner* — Didarul A Mazumder
(74) *Attorney, Agent, or Firm* — Baker Botts LLP (57) ABSTRACT

Disclosed is a packaging method for circuit units, wherein the circuit units comprise a silicon layer substrate and a silicon dioxide layer overlaid on the silicon layer substrate. The packaging method for a circuit unit comprises: attaching a plurality of circuit units to a circuit baseplate in a spaced and inverted mode, wherein the silicon dioxide layer is attached to the circuit baseplate, and the silicon layer substrate faces away from the circuit baseplate; forming an insulator between the circuit units; removing the silicon layer substrate to expose the silicon dioxide layer; and forming an electromagnetic shielding layer on the silicon dioxide layer and the insulator.

10 Claims, 4 Drawing Sheets

(51) Int. Cl.
*H01L 21/56* (2006.01)
*H01L 23/00* (2006.01)

(58) Field of Classification Search
USPC .......................................................... 438/110
See application file for complete search history.

(56) References Cited

U.S. PATENT DOCUMENTS

2018/0301365 A1* 10/2018 Kilcoyne .......... H01L 21/30625
2020/0006181 A1*  1/2020 Chen ................... H01L 25/0657
2020/0395248 A1* 12/2020 Sakuma .............. H01L 21/6836

FOREIGN PATENT DOCUMENTS

| CN | 109841559 A | 6/2019 |
| CN | 110233139 A | 9/2019 |
| CN | 110267431 A | 9/2019 |

* cited by examiner

PACKAGING METHOD FOR CIRCUIT UNITS COMPRISING CIRCUIT BASEPLATE

CROSS-REFERENCE TO RELATED APPLICATIONS

This application is a National Stage of International Application No. PCT/CN2019/123558, filed on Dec. 6, 2019, which claims priority to Chinese Patent Application No. 201910529562.8, filed on Jun. 18, 2019, both of which are hereby incorporated by reference in its entirety.

TECHNICAL FIELD

The present disclosure relates to the technical field of electronics, and in particular to a packaging method for circuit units.

BACKGROUND

In the prior art, a circuit unit is usually plastic packaged directly by a layer of colloid so as to package the circuit unit of a printed circuit board, thus packaging the circuit unit between the colloid and the printed circuit board. But in this way, the circuit unit has poor heat dissipation performance, and the circuit unit tends to be interfered by an external radio-frequency signal, resulting in poor electromagnetic shielding performance.

SUMMARY

A main purpose of the present disclosure is to provide a packaging method for circuit units, which aims at solving the problems of poor heat dissipation performance and electromagnetic shielding performance of a circuit unit caused by an existing packaging method for a circuit unit.

In order to realize this purpose, the embodiments of the present disclosure provide a packaging method for a circuit unit. The circuit unit includes a silicon layer substrate and a silicon dioxide layer overlaid on the silicon layer substrate. The packaging method for a circuit unit includes:
  attaching a plurality of circuit units to a circuit baseplate in a spaced and inverted mode, where the silicon dioxide layer is attached to the circuit baseplate, and the silicon layer substrate faces away from the circuit baseplate;
  forming an insulator between the circuit units;
  removing the silicon layer substrate to expose the silicon dioxide layer; and
  forming an electromagnetic shielding layer on the silicon dioxide layer and the insulator.

Preferably, the forming an insulator between the circuit units includes:
  plastic packaging the circuit baseplate by epoxy resin, where the epoxy resin covers the circuit baseplate and the circuit unit, and the epoxy resin fills a gap between the circuit units; and
  grinding the epoxy resin to remove epoxy resin covering the circuit unit and leave epoxy resin between the circuit units, so as to form the insulator.

Preferably, the grinding the epoxy resin includes:
  controlling a grinding jig to rotate in the same direction as the epoxy resin, where the grinding jig and the epoxy resin have different rotation speeds.

Preferably, the controlling a grinding jig to rotate in the same direction as the epoxy resin includes:
  controlling the grinding jig to rotate at a first preset rotating speed to conduct rough grinding on the epoxy resin; controlling the grinding jig to rotate at a second preset rotating speed to conduct fine grinding on the epoxy resin; and controlling the grinding jig to polish the epoxy resin,
  where the first preset rotating speed is greater than the second preset rotating speed.

Preferably, the removing the silicon layer substrate to expose the silicon dioxide layer includes: removing the silicon layer substrate through corrosion by hydrofluoric acid solution.

Preferably, in the removing the silicon layer substrate through corrosion by hydrofluoric acid solution, the hydrofluoric acid solution includes hydrofluoric acid and barium sulfate, and a concentration ratio of the hydrofluoric acid to the barium sulfate is 10:1.

Preferably, the forming an electromagnetic shielding layer on the silicon dioxide layer includes:
  forming the electromagnetic shielding layer on the silicon dioxide layer through a dispensing process, a coating process or a sputtering process.

Preferably, when forming the electromagnetic shielding layer on the silicon dioxide layer through a dispensing process, a coating process or a sputtering process,
  the electromagnetic shielding layer is made of semiconductive silver adhesive, aluminum nitride ceramics or organic glass, where the semiconductive silver adhesive is obtained by adding metal particles into the epoxy resin.

Preferably, when forming the electromagnetic shielding layer on the silicon dioxide layer through a dispensing process, a coating process or a sputtering process,
  the semiconductive silver adhesive, the aluminum nitride ceramics and the organic glass are transparent or semi-transparent.

Preferably, the method further includes, after forming an electromagnetic shielding layer on the silicon dioxide layer:
  cutting the plurality of circuit units into a plurality of separate circuit modules along a position of the insulator.

According to the packaging method for a circuit unit of the present disclosure, the circuit units are attached to the circuit baseplate in a spaced and inverted mode, the insulator fills the gap between the circuit units, then the silicon layer substrate of the circuit unit is removed, and the electromagnetic shielding layer is formed on the insulator and the silicon dioxide layer, thus achieving a desirable electromagnetic shielding effect; the electromagnetic shielding layer is made of a high-dielectric-constant material and has efficient electric conduction and heat conduction characteristics, so that heat generated in a working process of the circuit unit may be timely transferred and dissipated, adverse factors of low heat conduction performance, high brittleness and low reliability of the silicon layer substrate are eliminated, and the situation that a metal package shell is formed by metal again on the circuit baseplate is avoided, thus facilitating batch production.

BRIEF DESCRIPTION OF THE DRAWINGS

In order to illustrate embodiments of the present disclosure or technical solutions in the prior art more clearly, brief introduction on drawings needed to be used in description of the embodiments or the prior art is made below. It is obvious that the drawings described below are merely some embodiments of the present disclosure. Those skilled in the art further can obtain other drawings in accordance with structures shown in the drawings without creative efforts.

Further description on implementation of purposes, functional characteristics and advantages of the present disclosure is made in combination with embodiments with reference to drawings.

DESCRIPTION OF THE EMBODIMENTS

Clear and intact description on the technical solution in the embodiments of the present disclosure will be made in combination with drawings in the embodiments of the present disclosure. It is obvious that the embodiments described are only a part of embodiments of the present disclosure, and are not all of embodiments thereof. Based on the embodiments of the present disclosure, all the other embodiments obtained by those of ordinary skill in the art without inventive effort are within the scope of the present disclosure.

It should be noted that all directional indications (such as upper, lower, left, right, front, rear, etc.) in the embodiments of the present disclosure are only used to describe the relative positional relation, the movement situation, etc. among components in a certain posture (as shown in the drawings). If the specific posture changes, the directional indications will change accordingly.

Furthermore, the technical solutions between the various embodiments may be combined with each other, but must be on the basis that the combination thereof can be implemented by those of ordinary skill in the art. In case of a contradiction with the combination of the technical solutions or a failure to implement the combination, it should be considered that the combination of the technical solutions does not exist, and is not within the protection scope of the present disclosure.

Figures 1, 2A:
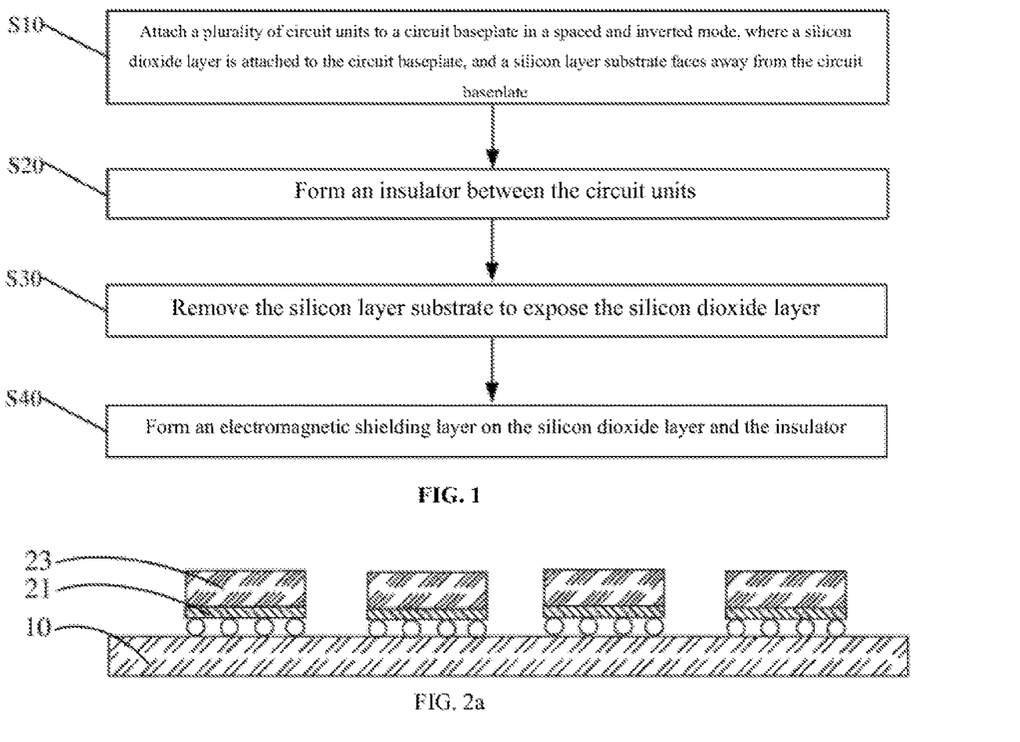
FIG. 1 is a schematic diagram of a process of Embodiment 1 of a packaging method for a circuit unit in the present disclosure.
FIGS. 2a-2f are schematic diagrams of a structure and a process of one embodiment of the packaging method for a circuit unit in the present disclosure.

With reference to FIGS. 1 to 3, FIG. 2a is a schematic diagram of attaching a plurality of circuit units 20 to a circuit baseplate in a spaced and inverted mode in a packaging method for a circuit unit; FIG. 2b is a schematic diagram of plastic packaging epoxy resin; FIG. 2c is a schematic diagram of ground epoxy resin; FIG. 2d is a schematic diagram of a corroded silicon layer substrate; FIG. 2e is a schematic diagram of forming an electromagnetic shielding layer; and FIG. 2f is a schematic diagram of cutting the circuit units into circuit modules. The embodiments of the present disclosure provide a packaging method for a circuit unit. The circuit unit includes a silicon layer substrate and a silicon dioxide layer overlaid on the silicon layer substrate. As Embodiment 1 of the packaging method for a circuit unit of the present disclosure, the packaging method for a circuit unit includes:

S10, a plurality of circuit units are attached to a circuit baseplate in a spaced and inverted mode, where the silicon dioxide layer is attached to the circuit baseplate, and the silicon layer substrate faces away from the circuit baseplate.

In the embodiment, the plurality of circuit units are attached to the circuit baseplate, such as a printed circuit board, through a surface mount technology (SMT), a die bond (DB) technology or other mount technologies. In the prior art, the circuit unit is usually attached to the circuit baseplate in a forward mode, that is, the silicon layer substrate of the circuit unit is attached to the circuit baseplate and the silicon dioxide layer is arranged on the silicon layer substrate. However, in the embodiment, the circuit unit is attached to the circuit baseplate in an inverted mode, that is, the silicon dioxide layer is attached to the circuit baseplate and the silicon layer substrate faces away from the circuit baseplate and arranged on the silicon dioxide layer, which aims to arrange the silicon layer substrate on an upper surface to facilitate subsequent removal of the silicon layer substrate and only leave the silicon dioxide layer.

Figure 2B:
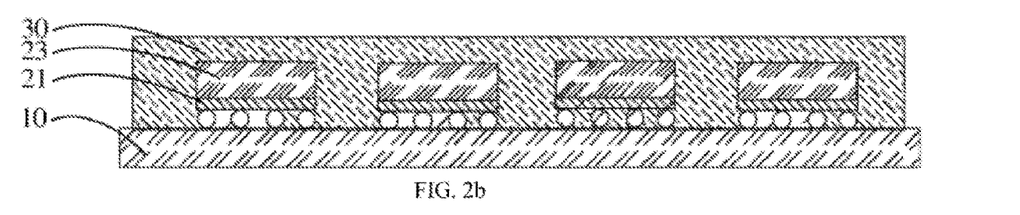

S20, an insulator is formed between the circuit units.

Figure 2C:
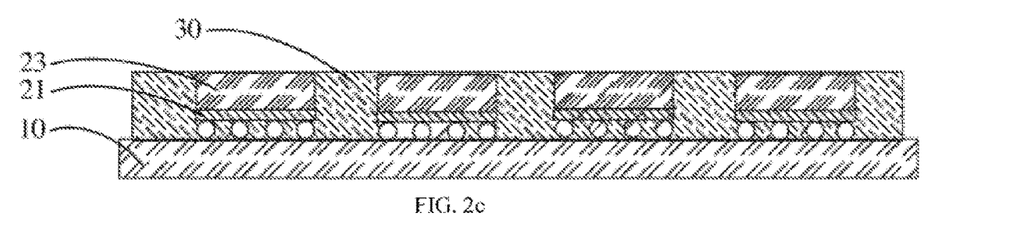

In the embodiment, the circuit units are arranged in a spaced mode so as to fill a space between the circuit units with the insulator, the insulator may be made of non-conductive epoxy resin, etc., an insulating medium is formed on the circuit baseplate through a coating process or a dispensing process, an insulating medium on the silicon layer substrate is removed through a grinding process to expose the silicon layer substrate, and an insulating medium between the circuit units is left to form the insulator. The insulator insulates different circuit units and also protects the circuit unit.

Figure 2D:
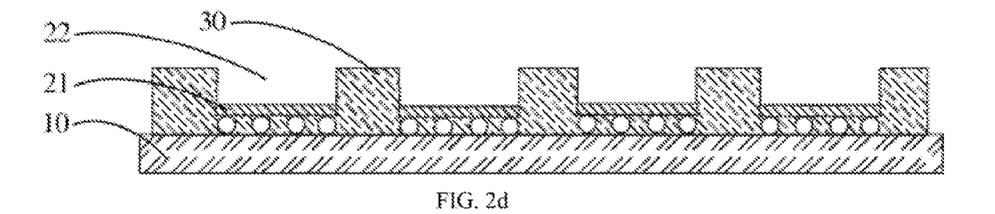

S30, the silicon layer substrate is removed to expose the silicon dioxide layer.

In the embodiment, the silicon layer substrate exposed at the upper surface may be removed through an etching process or an acid liquor corrosion process so as to expose the silicon dioxide layer at an outer surface.

Figure 2E:
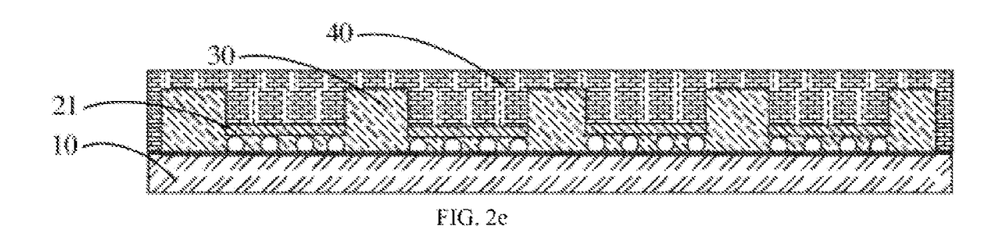

S40, an electromagnetic shielding layer is formed on the silicon dioxide layer and the insulator.

In the embodiment, the electromagnetic shielding layer may be formed on the silicon dioxide layer and the insulator through the coating process, the dispensing process or the sputtering process, the electromagnetic shielding layer forms a metal shielding cover to isolate a circuit chip in the electromagnetic shielding layer from an external electromagnetic interference signal, thus achieving high resistance to harmonic interference of the circuit chip.

In conclusion, according to the present disclosure, the circuit units are attached to the circuit baseplate in a spaced and inverted mode, the insulator fills the gap between the circuit units, then the silicon layer substrate of the circuit unit is removed, and the electromagnetic shielding layer is formed on the insulator and the silicon dioxide layer, thus achieving a desirable electromagnetic shielding effect; and the electromagnetic shielding layer is made of a high-dielectric-constant material and has efficient electric conduction and heat conduction characteristics, so that heat generated in a working process of the circuit unit may be timely transferred and dissipated, adverse factors of low heat conduction performance, high brittleness and low reliability of the silicon layer substrate are eliminated, and the step that a metal package shell is formed by metal again on the circuit baseplate is omitted, thus facilitating batch production.

Figure 4:
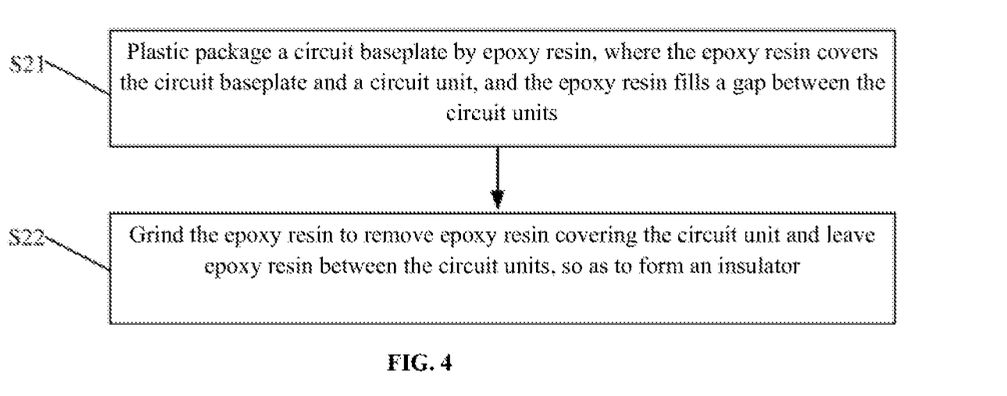
FIG. 4 is a schematic diagram of a specific process of S20 in the packaging method for a circuit unit in the present disclosure.

With reference to FIGS. 2 and 4, based on the Embodiment 1, an Embodiment 2 of the packaging method for a circuit unit of the present disclosure is provided. The S20 includes the following steps that S21, the circuit baseplate is plastic packaged by epoxy resin, where the epoxy resin covers the circuit baseplate and the circuit unit, and the epoxy resin fills a gap between the circuit units; and S22, the epoxy resin is ground to remove epoxy resin covering the circuit unit and leave epoxy resin between the circuit units, so as to form the insulator.

In the embodiment, the circuit baseplate is plastic packaged by the epoxy resin so as to plastic package the whole circuit baseplate by the epoxy resin, meanwhile the epoxy resin fills the gap between the circuit units, and then the epoxy resin is ground through the grinding process, so that a thickness of the epoxy resin is gradually reduced until the silicon layer substrate of the circuit unit is exposed at a surface, then the epoxy resin filling the space between the circuit units is left to form the insulator, and in this case, the insulator is flush with the silicon layer substrate of the circuit unit.

Based on the Embodiments 1 and 2, an Embodiment 3 of the packaging method for a circuit unit of the present disclosure is provided. The S22 includes the following step that S221, a grinding jig is controlled to rotate in the same direction as the epoxy resin, where the grinding jig and the epoxy resin have different rotation speeds.

In the embodiment, the grinding jig is controlled to rotate in the same direction as the epoxy resin. For example, the grinding jig and the epoxy resin rotate anticlockwise or clockwise, and the grinding jig and the epoxy resin move relatively due to a rotating speed difference between the grinding jig and the epoxy resin. The grinding jig and the epoxy resin rotate in the same direction, so that the circuit unit in the epoxy resin may be prevented from being damaged by stress caused by huge pulling force generated between the grinding jig and the epoxy resin, thus improving a yield of the circuit unit.

Figure 5:
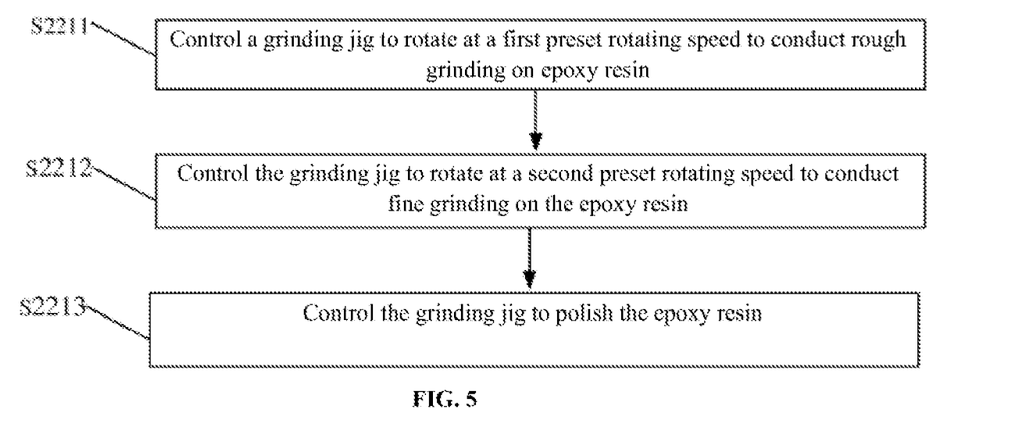
FIG. 5 is a schematic diagram of a specific process of S221 in the packaging method for a circuit unit in the present disclosure.

With reference to FIG. 5, based on the Embodiments 1 to 3, an Embodiment 4 of the packaging method for a circuit unit of the present disclosure is provided. The S221 includes the following steps that S2211, the grinding jig is controlled to rotate at a first preset rotating speed to conduct rough grinding on the epoxy resin;

S2212, the grinding jig is controlled to rotate at a second preset rotating speed to conduct fine grinding on the epoxy resin; and S2213, the grinding jig is controlled to polish the epoxy resin, where the first preset rotating speed is greater than the second preset rotating speed.

In the embodiment, at an initial stage of grinding the epoxy resin, the epoxy resin is thick, so the epoxy resin may be subjected to the rough grinding so as to accelerate grinding, and in this case, the epoxy resin is ground by means of diamond with a high roughness at a surface of the grinding jig. For example, during the rough grinding, a grinding wheel of the grinding jig may be set to have a feeding speed 30 mm/s and a rotating speed 1200-4500 turns/min, the roughness of the diamond on the grinding wheel may be set as 300 #, and a rotating speed of the epoxy resin may be set as 2500-4500 turns/min.

At a fine grinding stage, the epoxy resin already becomes thin, so the feeding speed of the grinding wheel of the grinding jig may be appropriately reduced to 3 mm/s and/or the roughness of the diamond may be appropriately reduced to 5000 #-8000 #to prevent the circuit unit in the epoxy resin from being damaged. The rotating speed of the grinding wheel of the grinding jig may be appropriately reduced or remain unchanged but a speed of the epoxy resin is slightly increased so as to reduce a speed difference between the grinding jig and the epoxy resin, thus achieving a fine grinding effect.

At a polishing stage, a surface of the epoxy resin is ground by means of coated abrasive. A hardness of the coated abrasive is low; so the rotating speed and the feeding speed may be not limited. The coated abrasive makes the surface of the epoxy resin smoother and flatter and removes the epoxy resin remaining on the silicon layer substrate so as to completely expose the silicon layer substrate, thus facilitating subsequent complete removal of the silicon layer substrate.

Based on the Embodiments 1 to 4, an Embodiment 5 of the packaging method for a circuit unit of the present disclosure is provided. The S30 includes the following step that S31, the silicon layer substrate is removed through corrosion by hydrofluoric acid solution.

In the embodiment, the silicon layer substrate is etched away by means of the hydrofluoric acid solution. A main component of the silicon layer substrate is Si, and a chemical equation of a reaction between Si and hydrofluoric acid is $Si+4HF=SiF_4\uparrow+2H_2\uparrow$. If a concentration of the hydrofluoric acid is high, generated silicon tetrafluoride may form $H_2SiF_6$, an ionic equation is $Si+6HF=2H^++SiF_6(2-)+2H_2\uparrow$, and $SiF_4$ may constantly volatilize, so that chemical equilibrium is broken. The process is continuously conducted due to volatilization of $SiF_4$, so the silicon layer substrate may be removed by means of the hydrofluoric acid in a low-cost mode.

Preferably, in the S31, the hydrofluoric acid solution includes the hydrofluoric acid and barium sulfate, and a concentration ratio of the hydrofluoric acid to the barium sulfate is 10:1.

In the embodiment, the barium sulfate is used for determining whether Si in the silicon layer substrate is completely dissolved and etched. A concentration of the hydrofluoric acid is 1.2 ml/L, a concentration of the barium sulfate is 0.12 ml/L, and the concentration ratio of the hydrofluoric acid to the barium sulfate is 10:1, so that it is guaranteed that the hydrofluoric acid has a high corrosion speed.

Based on the Embodiments 1 to 5, an Embodiment 6 of the packaging method for a circuit unit of the present disclosure is provided. The S40 includes the following step that S41, the electromagnetic shielding layer is formed on the silicon dioxide layer through a dispensing process, a coating process or a sputtering process.

In the embodiment, the electromagnetic shielding layer has an electromagnetic shielding function and is made of semiconductive silver adhesive, aluminum nitride ceramics or organic glass, where the semiconductive silver adhesive is obtained by adding metal particles into the epoxy resin. When the circuit unit is a photosensitive element, the semiconductive silver adhesive, the aluminum nitride ceramics and the organic glass are transparent or semitransparent, so that light is capable of entering a conductive shield from the electromagnetic shielding layer to be received by the photosensitive element.

Figure 2F:
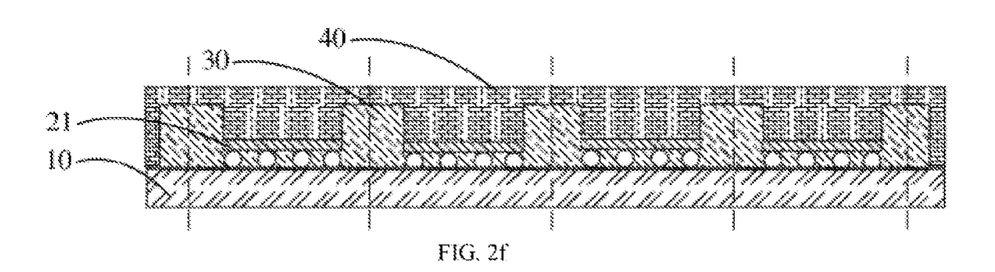
Figure 6:
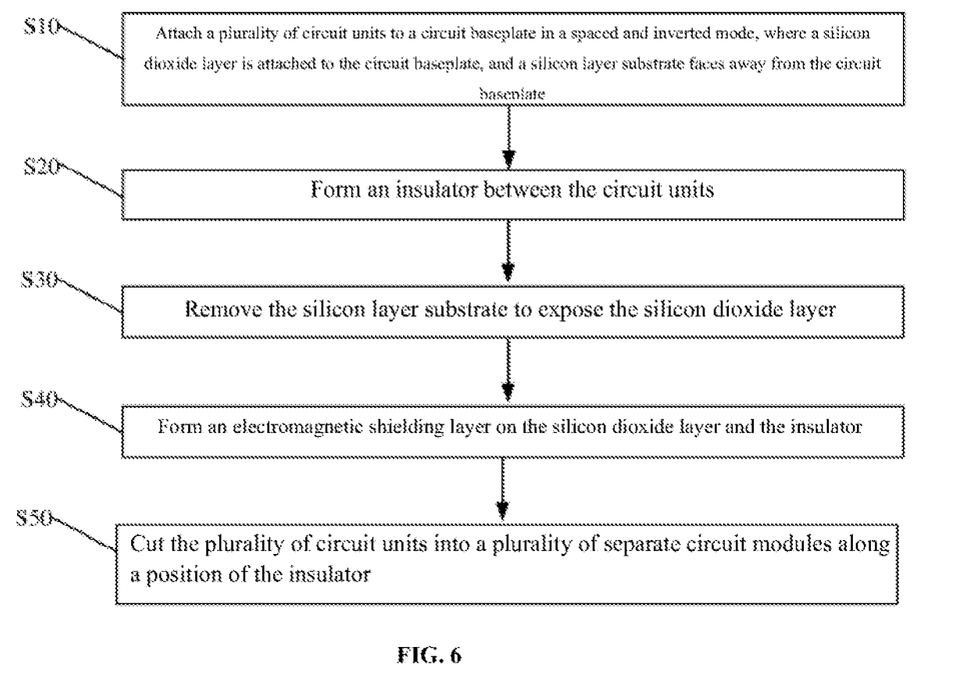
FIG. 6 is a schematic diagram of a process of Embodiment 2 of the packaging method for a circuit unit in the present disclosure.

With reference to FIG. 6, based on the Embodiments 1 to 6, an Embodiment 7 of the packaging method for a circuit unit of the present disclosure is provided, after the S40, the method further includes the following step that S50, the plurality of circuit units are cut into a plurality of separate circuit modules along a position of the insulator.

In the embodiment, the plurality of circuit units are cut into the plurality of separate circuit modules along the position of the insulator, that is, the circuit modules may be mounted in an electronic apparatus for use. According to the present disclosure, electromagnetic shielding is conducted on different circuit units on the same circuit baseplate, and then the different circuit units are cut into the circuit modules capable of being independently used, so that production efficiency is improved, each of the circuit modules has the efficient electric conduction and heat conduction characteristics and desirable electromagnetic shielding performance, the heat generated in a working process of the circuit modules may be timely transferred and dissipated, and the adverse factors of the low heat conduction performance, the high brittleness and the low reliability of the silicon layer substrate are eliminated.

Figure 3:
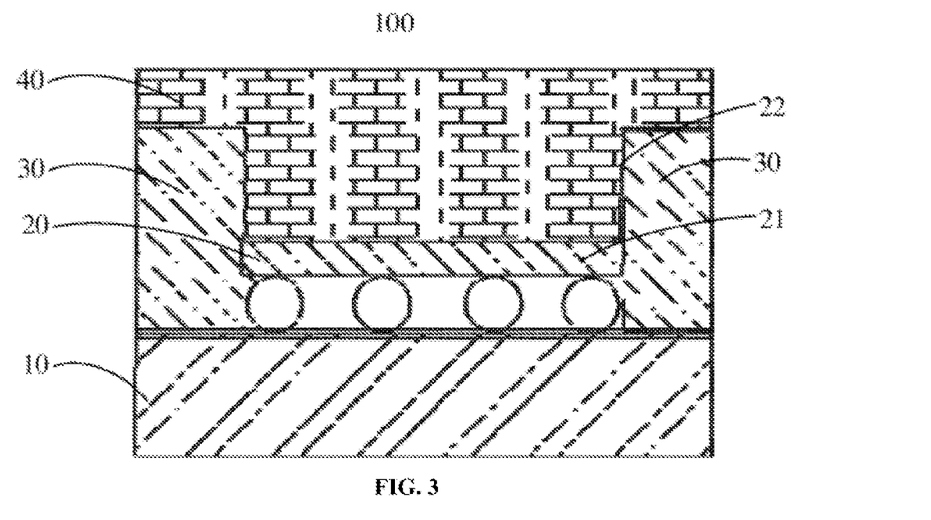
FIG. 3 is a structural schematic diagram of a packaging structure for a circuit unit in the present disclosure.

With reference to FIGS. 2-3, in order to realize the purpose, the embodiments of the present disclosure provide a packaging structure 100 for a circuit unit 20. The packaging structure 100 for a circuit unit 20 is manufactured through a packaging process for a circuit unit 20. The packaging structure 100 for a circuit unit 20 includes: a circuit baseplate 10, where the circuit baseplate 10 is provided with the circuit unit 20, and the circuit unit 20 includes a silicon dioxide layer 21 and an electronic device (not shown in the figures) arranged on the silicon dioxide layer 21; an insulator 30, where the insulator 30 surrounds the circuit unit 20; and an electromagnetic shielding layer 40, where the electromagnetic shielding layer 40 covers the circuit unit 20 and the insulator 30.

In the embodiment, the circuit baseplate 10, the silicon dioxide layer 21 and the electromagnetic shielding layer 40 are arranged in an overlaid mode, and a silicon layer substrate 23 on the silicon dioxide layer 21 in the prior art is removed (see FIGS. 2a-2c), thus achieving the desirable electromagnetic shielding effect; the electromagnetic shielding layer 40 is made of the high-dielectric-constant material and has the efficient electric conduction and heat conduction characteristics, so that the heat generated in the working process of the circuit unit 20 may be timely transferred and dissipated, the adverse factors of the low heat conduction performance, the high brittleness and the low reliability of the silicon layer substrate 23 are eliminated, and the step that the metal package shell is formed by the metal again on the circuit baseplate 10 is omitted, thus facilitating the batch production; and the silicon layer substrate 23 is removed, so a thickness of the whole packaging structure 100 for a circuit unit 20 becomes thinner. For example, when the circuit unit 20 is a radio-frequency (RF) unit, a thickness of the packaging structure 100 for a circuit unit 20 may be made to be 400 mm.

Preferably, the insulator 30 is convexly arranged between the circuit units 20 such that the insulator and the silicon dioxide layer 21 form a recess 22 in a surrounding mode, and the electromagnetic shielding layer 40 fills the recess 22 to contact with the silicon dioxide layer 21.

In the embodiment, the recess 22 is formed by corroding an original silicon layer substrate 23 of the circuit unit 20 by hydrofluoric acid, and the silicon layer substrate 23 is flush with the insulator 30 through the grinding process before being corroded; and the recess 22 may be filled with the electromagnetic shielding layer 40, so that the electromagnetic shielding layer 40 makes direct contact with the silicon dioxide layer 21, heat generated by the circuit unit 20 is timely transferred out, the electromagnetic shielding layer 40 is limited in the recess 22 and connected to the silicon dioxide layer 21 at the insulator 30, and connecting stability of the electromagnetic shielding layer 40 may be enhanced.

Preferably, the silicon dioxide layer 21 is arranged on the circuit baseplate 10 through surface mounting. In the embodiment, the plurality of circuit units 20 are attached to the circuit baseplate 10, such as a printed circuit board, through a SMT, a DB technology or other mount technologies, the circuit unit 20 is attached to the circuit baseplate 10 in an inverted mode, that is, the silicon dioxide layer 21 is attached to the circuit baseplate 10 and the silicon layer substrate 23 faces away from the circuit baseplate 10 and arranged on the silicon dioxide layer 21, which aims to arrange the silicon layer substrate 23 on an upper surface to facilitate subsequent removal of the silicon layer substrate 23 and leave the silicon dioxide layer 21 to be connected to a magnetic shielding layer.

Preferably, the electromagnetic shielding layer 40 is made of semiconductive silver adhesive and the semiconductive silver adhesive is obtained by adding metal particles into epoxy resin, or the electromagnetic shielding layer 40 is made of aluminum nitride ceramics, or the electromagnetic shielding layer 40 is made of organic glass; and when the circuit unit 20 is a photosensitive element, the semiconductive silver adhesive, the aluminum nitride ceramics and the organic glass are transparent or semitransparent, so that light is capable of entering a conductive shield from the electromagnetic shielding layer 40 to be received by the photosensitive element.

In an embodiment, the electromagnetic shielding layer 40 is provided with a through hole (not shown in the figure), the circuit unit 20 is a patch antenna (not shown in the figure), and the patch antenna includes: a radio-frequency circuit (not shown in the figure), where the radio-frequency circuit is formed on the silicon dioxide layer 21; a radiating body (not shown in the figure), where the radiating body is formed on a surface, facing away from the silicon dioxide layer 21, of the electromagnetic shielding layer 40; and a feeder (not shown in the figure), where the feeder penetrates through the through hole and is connected to the radio-frequency circuit and the radiating body.

In the embodiment, the electromagnetic shielding layer 40 is provided with the through hole, and the feeder penetrates through the through hole to be connected to the radio-frequency circuit and the radiating body, so that a radio-frequency signal of the radio-frequency circuit is transmitted to the radiating body via the feeder, and the radiating body radiates the radio-frequency signal. Due to existence of the electromagnetic shielding layer 40, the radio-frequency signal of the radio-frequency circuit may be shielded in the electromagnetic shielding layer 40, the radio-frequency circuit cannot generate electromagnetic interference to a surrounding circuit, and the electromagnetic shielding layer 40 makes direct contact with the radio-frequency circuit, so that heat generated in a working process of the radio-frequency circuit may be transferred out. Moreover, the patch antenna does not have the silicon layer substrate 23, and a thickness of the patch antenna may be made to be very low; such as 400 mm, thus facilitating thinness and flattening of an electronic product.

Preferably, the electromagnetic shielding layer 40 is provided with at least two through holes (not shown in the figure), the circuit unit 20 is a pressure sensing circuit, and the pressure sensing circuit includes: a controller (not shown in the figure), where the controller is formed on the silicon dioxide layer 21; a pressure sensor (not shown in the figure), where the pressure sensor is arranged on a surface, facing away from the silicon dioxide layer 21, of the electromagnetic shielding layer 40; and a connecting line (not shown in the figure), where the connecting line penetrates through the through hole and is connected to the controller and the pressure sensor.

In the embodiment, the electromagnetic shielding layer 40 is provided with the through hole, and the connecting line penetrates through the through hole and is connected to the controller and the pressure sensor, so that a pressure signal detected by the pressure sensor is transmitted to the controller via the connecting line, and the controller conducts subsequent processing on the pressure signal. Due to the existence of the electromagnetic shielding layer 40, an external electromagnetic interference signal may be shielded outside the electromagnetic shielding layer 40, the controller cannot receive electromagnetic interference by the surrounding circuit, and the electromagnetic shielding layer 40 makes direct contact with the controller, so that heat generated in a working process of the controller may be transferred out.

It may be understood that the patch antenna and the pressure sensing circuit are only examples of the circuit unit 20, and the circuit unit 20 may be a circuit component with any function and a functional circuit composed of many same or different circuit components.

In order to realize this purpose, the embodiments of the present disclosure provide an electronic apparatus. The electronic apparatus includes the packaging structure 100 for a circuit unit 20. The electronic apparatus includes the packaging structure 100 for a circuit unit 20, and has at least the beneficial effects of the packaging structure 100 for a circuit unit 20, which is not described in detail herein.

What is described above is only a preferred embodiment of the present disclosure and does not limit the patent scope of the present disclosure. The equivalent structure change made by using contents of the description and the drawings in the present disclosure and used directly/indirectly in other related technical fields under the concept of the present disclosure shall all fall within the scope of protection of the present disclosure.

What is claimed is:

1. A packaging method for circuit units, wherein the circuit units comprise a silicon layer substrate and a silicon dioxide layer overlaid on the silicon layer substrate, comprising:
   attaching a plurality of circuit units to a circuit baseplate in a spaced apart and an inverted mode, wherein the silicon dioxide layer is attached to the circuit baseplate, and the silicon layer substrate faces away from the circuit baseplate;
   forming an insulator between each of the plurality of circuit units;
   removing the silicon layer substrate to expose the silicon dioxide layer; and
   forming an electromagnetic shielding layer on the silicon dioxide layer and the insulator.

2. The packaging method for circuit units according to claim 1, wherein the forming the insulator comprises:
   plastic packaging the circuit baseplate by epoxy resin, wherein the epoxy resin covers the circuit baseplate and the plurality of circuit units, wherein the epoxy resin fills a gap between each of the plurality of circuit units; and
   grinding the epoxy resin to remove a portion of the epoxy resin covering the plurality of circuit units and leaving the other portion of the epoxy resin between each of the plurality of circuit units, so as to form the insulator.

3. The packaging method for circuit units according to claim 2, wherein grinding the epoxy resin comprises:
   controlling a grinding jig to rotate in a same direction as the epoxy resin, wherein the grinding jig and the epoxy resin have different rotation speeds.

4. The packaging method for circuit units according to claim 3, wherein the controlling the grinding jig comprises:
   controlling the grinding jig to rotate at a first preset rotating speed to conduct rough grinding on the epoxy resin; controlling the grinding jig to rotate at a second preset rotating speed to conduct fine grinding on the epoxy resin; and controlling the grinding jig to polish the epoxy resin,
   wherein the first preset rotating speed is greater than the second preset rotating speed.

5. The packaging method for circuit units according to claim 1, wherein removing the silicon layer substrate to expose the silicon dioxide layer comprises:
   removing the silicon layer substrate through corrosion by hydrofluoric acid solution.

6. The packaging method for circuit units according to claim 5, wherein
   the hydrofluoric acid solution comprises hydrofluoric acid and barium sulfate, and a concentration ratio of the hydrofluoric acid to the barium sulfate is 10:1.

7. The packaging method for circuit units according to claim 1, wherein forming the electromagnetic shielding layer on the silicon dioxide layer comprises:
   forming the electromagnetic shielding layer on the silicon dioxide layer through a process selected from the group consisting of a dispensing process, a coating process and a sputtering process.

8. The packaging method for circuit units according to claim 7, wherein
   the electromagnetic shielding layer is made of semiconductive silver adhesive, aluminum nitride ceramics or organic glass, and wherein the semiconductive silver adhesive is obtained by adding metal particles into the epoxy resin.

9. The packaging method for circuit units according to claim 8, wherein the electromagnetic shielding layer is transparent or semitransparent.

10. The packaging method for circuit units according to claim 1, further comprising, after forming the electromagnetic shielding layer on the silicon dioxide layer:
    cutting the plurality of circuit units into a plurality of separate circuit modules along a position of the insulator.

* * * * *